US006854659B2

(12) United States Patent
Stahl et al.

(10) Patent No.: US 6,854,659 B2
(45) Date of Patent: Feb. 15, 2005

(54) INTERACTIVE SENSORS FOR ENVIRONMENTAL CONTROL

(75) Inventors: Lennart Stahl, Plano, TX (US); Christian Belady, McKinney, TX (US)

(73) Assignee: KLiebert Corporation, Columbus, OH (US)

(*) Notice: Subject to any disclaimer, the term of this patent is extended or adjusted under 35 U.S.C. 154(b) by 0 days.

(21) Appl. No.: 10/252,745

(22) Filed: Sep. 23, 2002

(65) Prior Publication Data

US 2003/0075313 A1 Apr. 24, 2003

Related U.S. Application Data

(60) Provisional application No. 60/324,354, filed on Sep. 21, 2001.

(51) Int. Cl.[7] ................................................. F24F 7/00
(52) U.S. Cl. ........................ 236/49.3; 62/229; 62/259.2; 361/696
(58) Field of Search ..................... 236/49.3; 62/259.2, 62/177, 178, 179, 180, 229; 361/688, 690, 694, 695, 696

(56) References Cited

U.S. PATENT DOCUMENTS

| | | | | | |
|---|---|---|---|---|---|
| 4,756,473 | A | * | 7/1988 | Takemae et al. | 236/49 |
| 4,874,127 | A | * | 10/1989 | Collier | 236/49.5 |
| 5,467,609 | A | * | 11/1995 | Feeney | 62/259.2 |
| 5,906,315 | A | * | 5/1999 | Lewis et al. | 236/49.3 |
| 6,247,531 | B1 | * | 6/2001 | Cowans | 165/206 |
| 6,283,380 | B1 | * | 9/2001 | Nakanishi et al. | 236/49.3 |
| 6,557,624 | B1 | * | 5/2003 | Stahl et al. | 165/53 |
| 6,662,865 | B2 | * | 12/2003 | Beitelmal et al. | 165/206 |
| 2004/0020225 | A1 | * | 2/2004 | Patel et al. | 62/229 |

FOREIGN PATENT DOCUMENTS

| | | | | | |
|---|---|---|---|---|---|
| GB | 2113012 | A | * | 7/1983 | H05K/7/20 |

* cited by examiner

*Primary Examiner*—Marc Norman
(74) *Attorney, Agent, or Firm*—Locke Liddell & Sapp LLP

(57) ABSTRACT

A system for cooling heat generating objects arranged in a room. The system adapts in real time to changing cooling demands of the objects. Remote sensors mounted in proximity to the heat generating objects relay information to cooling units, which adjust their operation in response to the information.

5 Claims, No Drawings

INTERACTIVE SENSORS FOR ENVIRONMENTAL CONTROL

CROSS-REFERENCE TO RELATED APPLICATIONS

This application claims priority to U.S. Provisional Patent Application Ser. No. 60/324,354, filed Sep. 21, 2001, having the same title and inventors as named herein, which is hereby incorporated by reference in its entirety.

BACKGROUND OF THE INVENTION

1. Technical Field of the Invention

The present invention relates to cooling systems for cooling electronic equipment, and particularly to systems for cooling electronic equipment that are reconfigurable to allow customized air flow in proximity to the electronic equipment.

2. Background and Objects of the Invention

The growth of the computer industry and telephony over the past few decades has been phenomenal. The integration of these technologies, for example, in telecommunications switching systems, has lead to greater and greater efficiencies as larger numbers of communications are handled by fewer components, which are typically housed in a central control room. One problem inherent with many existing cooling systems for electronic equipment is inflexibility. Many existing cooling systems are built into and/or under the flooring of a temperature-controlled room having equipment needing to be cooled. Such cooling systems employ fixed conduits or other piping for directing cooled air along a subsurface of the flooring and upwardly through the floor and towards the equipment to be cooled. The upwardly directed cooled air is in proximity to the equipment. In the event the temperature characteristics within the temperature-cooled room changes, such as by the equipment being moved within the room or by additional equipment being added therein, it is very difficult to modify the cooling system accordingly. For instance, the conduits have to be detached from their fixed positions and repositioned or replaced in favor of differently sized conduits. Consequently, altering the cooling characteristics of existing cooling systems frequently proves a costly adventure. Floor-based cooling systems present additional difficulties other than inflexibility in cooling characteristics. For instance, floor-based cooling systems that do not utilize conduits for passing cooled air occupy more area so that equipment cabling and other obstructions do not cause uneven air distribution or a reduction in air pressure. Such systems require the equipment cabling to be plenum rated, thereby increasing system cost. Floor-based cooling systems also possess the tendency to distribute noise and vibrations, which may effect the operation of the equipment to be cooled.

In addition, floor-based and other existing cooling systems have a rather limited cooling capability. For instance, existing cooling systems have heat densities of approximately 80 watts per square foot ($W/ft^2$) with planned cooling systems being claimed to possess heat densities of up to 150 $W/ft^2$. Cooling systems having such heat densities, however, may not effectively cool today's equipment, such as state-of-the-art computational equipment.

Existing cooling systems typically sense the return temperature from, or the supply temperature to the whole room to control the capacity of the cooling system. Local adjustment of the cooling capacity is normally done by moving perforated tiles in the raised floor that are used for cold air distribution. This manual reconfiguration of a cooling system is inconvenient and time consuming.

As is readily apparent, if equipment is not effectively cooled, the internal temperature of the electronic components in the equipment substantially increases, thereby leading to significantly reduced system performance and, in some cases, total system failure. If a cooling system inefficiently cools the equipment, either the equipment may fail due to increased operating temperature or the costs for cooling the equipment may be unnecessarily high. What is needed, then, is a cooling system having its cooling characteristics closely tailored to the heating characteristics of the equipment to be cooled and that is adjustable in real time in response to changing local heat conditions.

One solution has been a ceiling-mounted cooling system comprising heat exchanger and a plurality of fans positioned below the heat exchanger as described in co-pending U.S. patent application Ser. Nos. 09/617,391; 09/635,374; and 09/617,213; each assigned in common herewith. When the fans are activated, heated air is drawn up through a first portion of the heat exchanger and then down through a second portion of the heat exchanger. This system is advantageous in that it is more easily configurable to the spatial heating requirements of the room, but it lacks the capability of automatic, real time adaptation to local heating requirements.

SUMMARY OF THE INVENTION

One aspect of the present invention is a cooling system for cooling discrete heat generating objects. The cooling system comprises a cooling unit and a remote sensor mounted in proximity to the heat generating (inside or outside of the rack/module/PCB) object such that feedback from the sensor controls the operation of the cooling unit.

According to one embodiment of the present invention, the sensor is an air temperature sensor. According to an alternative embodiment, the sensor is an airflow sensor.

DESCRIPTION OF ILLUSTRATIVE EMBODIMENTS

One aspect of the present invention is an apparatus for cooling heat generating objects while overcoming the deficiencies discussed above. One of skill in the art will recognize that an apparatus of the instant invention is suitable for cooling a wide variety of heat generating objects and is particularly suit for cooling a plurality of discrete, heat generating objects distributed in a room. A particularly suitable application for an apparatus of the instant invention is cooling electronic equipment arranged in a room, for example, computers or telecommunications equipment housed in a central control room.

A cooling system of the instant invention comprises a cooling unit and a remote sensor. The remote sensor senses a condition in the immediate environment of the heat generating object and relays this data to the cooling unit. The operating parameters of the cooling unit are adjusted automatically in response to the cooling requirements in the vicinity of the heat generating object.

The remote sensor of the present invention may be one or more of several types of sensors known in the art. For example, the sensor may be an air temperature sensor, thereby allowing the operating parameters of the cooling unit to automatically adjust according to the air temperature in the vicinity of the heat generating object.

Alternatively, the sensor may be an airflow sensor. Many types of electronic devices are equipped with ventilation systems with fans that are internally controlled so that the fan speed increases as the device heats up. Therefore, an airflow sensor positioned in proximity to the ventilation system of the device provides data indicating the cooling requirement of the device.

Many types and configurations of cooling units are known in the art and may be used in a cooling system according to the instant invention. One example is a floor-based cooling system. According to one embodiment, a floor-based cooling system of the present invention adjusts to changing cooling requirements by automatically adjusting dampers or diffusers in response to the data transmitted by the remote sensors.

As discussed above, ceiling-mounted cooling units offer several advantages over floor-based systems. A particularly suitable cooling unit comprises a fluid cooled heat exchanger and one or more fans positioned below the heat exchanger. When the fans are activated, airflow is drawn up through a first section of the heat exchanger and back down through a second section of the heat exchanger, where it is directed toward a heat generating object.

Such a cooling unit, as a component of a cooling system of the instant invention, offers several methods for automatically adjusting to changing cooling requirements within a room. According to one embodiment, feedback from the remote sensors can trigger automatic adjustment of fan speed or airflow through the unit. The fans in the cooling unit can be controlled in steps with several steps for each fan (or step less fan speed control) or by just turning each fan on/off in sequence. In addition, the air mass flow or direction can be adjusted with dampers.

Alternatively, the temperature of the coolant or flow velocity of the coolant within the heat exchanger is controlled. The temperature can be adjusted by valves (diverter/mixing/throttle) or speed control (steps or step less) of the cooling device, for example, the compressor. The flow velocity can be adjusted with valves (diverter/mixing/throttle) or speed control (steps or step less) of the pumping device, for example, the pump.

According to one embodiment of the instant invention, the fan unit comprises a damper or diffusers for directing air flow. The positioning of the dampers or diffusers are automatically controlled by information relayed by the remote sensors.

Inventors of co-pending U.S. patent application Ser. Nos. 09/617,391; 09/635,374; and 09/617,213 describe a ceiling-mounted cooling unit as in the previous paragraph, wherein the fans are mounted in a unit that is adjustably positioned below the heat exchanger. The fan unit can be repositioned along the bottom face of the heat exchanger in response to changing spatial cooling requirements. When used as a component of a cooling system according to the instant invention, this repositioning is automatically actuated in response to data transmitted from a remote sensor located in the vicinity of a heat generating object.

Modular ceiling-mounted cooling units are particularly suitable for cooling large rooms because a plurality of such units can be positioned adjacent to each other throughout the room. According to the instant invention, each of the units can be individually adjusted in response to feedback from sensors positioned near each of the heat generating objects. Such adjustment occurs in real time in response to the changing cooling requirements of the objects within the room.

Data transfer between the remote sensors and the cooling units can be accomplished by any means of data transfer known in the art. The sensors and the cooling units may be "hard wired" to each other. Alternatively, data is transferred between the sensors and the cooling units via wireless communication. Any of the protocols for wireless data transfer known in the art may be used. Examples include X-10, Bluetooth.

A cooling system of the instant invention provides a highly flexible response to changing cooling requirements because multiple sensors may be in communication with multiple cooling units. According to one embodiment, the instant invention provides a central hub through which data transfer between a plurality of remote sensors and one or more cooling units is controlled.

It will be apparent to one of skill in the art that described herein is an apparatus for cooling heat generating objects arranged in a room. While the invention has been described with references to specific embodiments, it is not limited to these embodiments. The invention may be modified or varied in many ways and such modifications and variations as would be obvious to one of skill are within the scope and spirit of the invention and are included within the scope of the following claims.

What is claimed is:

1. A cooling system for cooling a plurality of discrete heat generating objects in a room, the system comprising a plurality of cooling units, a plurality of remote sensors mounted in proximity to the heat generating objects, and a central hub for processing information from the remote sensors and transmitting instructions to each of the cooling units, wherein each of the cooling units comprises a heat exchanger containing a fluid coolant, and wherein the instructions from the central hub to each respective cooling unit control one or more parameters associated with that cooling unit, at least one of the one or more parameters being selected from the group consisting of coolant flow rate and coolant temperature.

2. A cooling system according to claim 1, wherein the sensor is located adjacent an air intake vent of the heat generating object.

3. A cooling system according to claim 1, wherein the remote sensors and cooling units communicate with the hub via a hard-wired connection, a wireless connection or any combination thereof.

4. A cooling system according to claim 1, wherein the at least one sensor comprises a plurality of sensors.

5. A method of cooling a plurality of heat generating objects comprising:

sensing one or more parameters of an environment containing the heat generating object; and in response to the one or more sensed parameters, independently modulating one or more parameters of at least one of a plurality of cooling units, each of said cooling units uniquely associated with one of the heat generating objects, wherein each of the cooling units comprises a heat exchanger containing a fluid coolant, and each of the one or more modulated parameters is selected from the group consisting of coolant flow rate and coolant temperature.

* * * * *

UNITED STATES PATENT AND TRADEMARK OFFICE
CERTIFICATE OF CORRECTION

PATENT NO. : 6,854,659 B2
DATED : February 15, 2005
INVENTOR(S) : Stahl et al.

It is certified that error appears in the above-identified patent and that said Letters Patent is hereby corrected as shown below:

<u>Title page,</u>
Item [73], Assignee, change "KLiebert" to -- Liebert --

Signed and Sealed this

Twenty-fourth Day of May, 2005

JON W. DUDAS
*Director of the United States Patent and Trademark Office*